United States Patent
Hieslmair (10) Patent No.: US 8,691,694 B2
(45) Date of Patent: Apr. 8, 2014

(54) SOLDERLESS BACK CONTACT SOLAR CELL MODULE ASSEMBLY PROCESS

(76) Inventor: Henry Hieslmair, Sunnyvale, CA (US)

(*) Notice: Subject to any disclaimer, the term of this patent is extended or adjusted under 35 U.S.C. 154(b) by 86 days.

(21) Appl. No.: 12/928,666

(22) Filed: Dec. 16, 2010

(65) Prior Publication Data

US 2011/0146747 A1 Jun. 23, 2011

Related U.S. Application Data

(60) Provisional application No. 61/284,584, filed on Dec. 22, 2009.

(51) Int. Cl.
  *H01L 21/44* (2006.01)
(52) U.S. Cl.
  USPC .............. 438/678; 438/57; 438/67; 438/73; 438/98; 257/E27.124; 257/E27.125; 257/E25.007
(58) Field of Classification Search
  USPC .......... 438/57, 67, 73, 98, 678; 257/E31.119, 257/E27.124, E27.125, E25.007
  See application file for complete search history.

(56) References Cited

U.S. PATENT DOCUMENTS

| | | | |
|---|---|---|---|
| 5,476,553 A * | 12/1995 | Hanoka et al. | 136/251 |
| 6,335,479 B1 * | 1/2002 | Yamada et al. | 136/251 |
| 6,429,037 B1 | 8/2002 | Wenham et al. | |
| 6,660,930 B1 * | 12/2003 | Gonsiorawski | 136/251 |
| 7,883,343 B1 * | 2/2011 | Mulligan et al. | 439/98 |
| 2007/0212510 A1 | 9/2007 | Hieslmair et al. | |
| 2008/0202576 A1 | 8/2008 | Hieslmair | |
| 2008/0210301 A1 | 9/2008 | Mulligan et al. | |
| 2008/0216887 A1 | 9/2008 | Hacke et al. | |

* cited by examiner

*Primary Examiner* — Michelle Mandala
(74) *Attorney, Agent, or Firm* — Lumen Patent Firm (57) ABSTRACT

In order to better and more efficiently assemble back contact solar cells into modules, the cell to cell soldering and other soldered connections are replaced by electro and/or electroless plating. Back contact solar cells, diodes and external leads can be first laminated to the module front glass for support and stability. Conductive materials are deposited selectively to create a plating seed pattern for the entire module circuit. Subsequent plating steps create an integrated cell and module metallization. This avoids stringing and tabbing and the associated soldering steps. This process is easier for mass manufacturing and is advantageous for handling fragile silicon solar cells. Additionally, since highly corrosion resistant metals can be plated, the moisture barrier requirements of the back side materials can be greatly relaxed. This can simplify and reduce the cost of the back side of the module.

15 Claims, 11 Drawing Sheets

```
┌─────────────────────────────────────────────────┐
│  Deposit seed layer stripes through shadow mask │
└─────────────────────────────────────────────────┘
┌─────────────────────────────────────────────────┐
│  Laminate cells, bypass diodes, and external leads │
│                to front glass                    │
└─────────────────────────────────────────────────┘
┌─────────────────────────────────────────────────┐
│  Deposit conductive seed material for cell-to-cell │
│   connections, bypass diode and external leads  │
└─────────────────────────────────────────────────┘
┌─────────────────────────────────────────────────┐
│  Immerse entire module in one or more plating baths │
│              and plate to thickness              │
└─────────────────────────────────────────────────┘
┌─────────────────────────────────────────────────┐
│    Plate highly corrosion resistant metal layer │
└─────────────────────────────────────────────────┘
┌─────────────────────────────────────────────────┐
│      Spray backing material to close module     │
└─────────────────────────────────────────────────┘
```

FIG. 10a

```
┌─────────────────────────────────────────────────┐
│            Laminate cells to front glass        │
└─────────────────────────────────────────────────┘
┌─────────────────────────────────────────────────┐
│     Laser pattern rear dielectric to expose silicon │
└─────────────────────────────────────────────────┘
┌─────────────────────────────────────────────────┐
│   Plate seed layer selectively in laser ablated openings │
└─────────────────────────────────────────────────┘
┌─────────────────────────────────────────────────┐
│   If needed, laser anneal plated seed metal to form │
│               good ohmic contacts                │
└─────────────────────────────────────────────────┘
┌─────────────────────────────────────────────────┐
│     Apply bypass diodes, external leads, and    │
│     temporary electrical connections if needed  │
└─────────────────────────────────────────────────┘
┌─────────────────────────────────────────────────┐
│  Deposit conductive seed material for cell-to-cell │
│   connections, bypass diode and external leads  │
└─────────────────────────────────────────────────┘
┌─────────────────────────────────────────────────┐
│     Immerse entire module and plate to thickness │
└─────────────────────────────────────────────────┘
┌─────────────────────────────────────────────────┐
│         Plate highly corrosion resistant layer  │
└─────────────────────────────────────────────────┘
┌─────────────────────────────────────────────────┐
│      Apply backing material to close module     │
└─────────────────────────────────────────────────┘
```

SOLDERLESS BACK CONTACT SOLAR CELL MODULE ASSEMBLY PROCESS

CROSS REFERENCE TO RELATED APPLICATIONS

This application claims the benefit of U.S. provisional patent application 61/284,584, filed on Dec. 22, 2009, entitled "Solderless Back Contact Solar Cell Module Assembly Process", and hereby incorporated by reference in its entirety.

FIELD OF INVENTION

The invention relates to a back contact solar cell metallization and module assembly process. In particular this disclosure relates to metal plating on the cell and module level for efficient assembly and connection.

BACKGROUND

Photovoltaic solar cells are semiconductor devices that convert light energy to useful electrical energy. Generally speaking, a solar cell typically includes a silicon wafer having regions of n-type doping and regions of p-type doping. Solar radiation generates mobile electrons and holes that migrate to the different regions and create a voltage differential between the two regions. Patterned metal layers on the silicon wafer are required to conduct the generated electricity out of the cell. The metallization of one cell is soldered to a separate piece which is then soldered to the next cell. Many such cells soldered together are then encapsulated between a front glass which faces the sun and a backing material which provides mechanical protection as well as a moisture barrier. Encapsulating materials include ethylene-vinyl acetate (EVA) and silicone polymers.

In solar cells based on crystalline silicon, the silicon itself is a major cost. In fact, the silicon alone can account for 20% to 30% of the cost of the finished product. Thus, there has been an increasing effort to develop thinner silicon cells. In recent years, the average thickness has decreases from approximately 300 microns to 160 microns. Many methods of producing thin crystalline silicon cells are being investigated. In the near future, wire saws may be able to create wafers as thin as 100 um routinely. A 100 um silicon wafer is very fragile and difficult to handle without fracture.

Typically, solar modules that are based on silicon wafers will undergo this general sequence of steps:
1. Fully metalize the cells. Screen printing of metal pastes and firing the pastes is commonly performed in the industry. Such screen printed pastes tend to produces lower efficiencies.
2. Test and bin the cells according to performance. Test probes are pushed onto the illuminated cell to measure actual performance. Similarly performing cells are binned together.
3. Solder leads to the cells. Referred to as "tabbing" the cells.
4. Solder cells together in series. Referred to as "stringing" the cells
5. Solder bypass diodes and external connection leads.
6. Transfer strings of soldered cells to a module. Referred to as "layup". This entails transferring many cells soldered together and laying them on to an encapsulant layer on top of the front glass of the module.
7. Add backing encapsulant, back layer, and laminate.

Figure 1A:
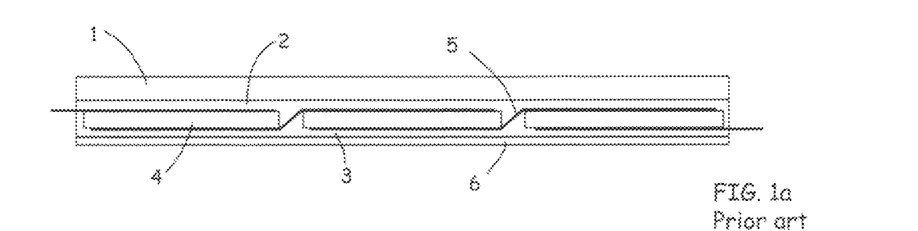
FIGS. 1a and 1b are illustrations of cross sections of module construction for front contacted and back contacted solar cells respectively. These illustrations show the physical arrangement of the front glass 1 which is toward the sun, the front and rear encapsulant layers 2 3, the silicon wafers 4, and the backing layers 6. Metal interconnects 5 are soldered to the metallization on the cells. For front contact cells, the metal interconnect must connect the front side of one wafer to the back side of the next wafer.
Figure 1B:
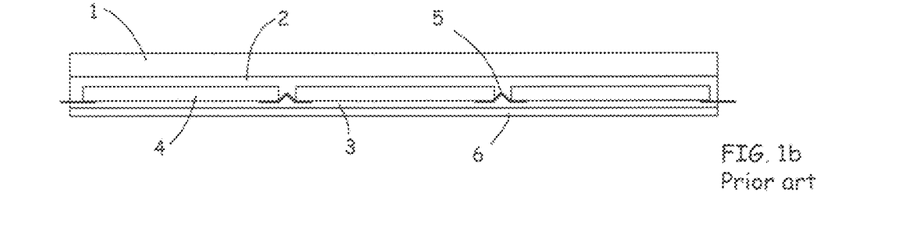

Typical present-day module constructions for front contact cells and back contact cells are shown in cross section in FIGS. 1a and 1b respectively. The front glass 1 faces the sun. The silicon solar cells 4 have metal pieces 5 soldered to them. For front contact cells, the metal pieces must be soldered to the front of one cell and to the back of the next cell as shown in FIG. 1a. For back contact cells, the metal pieces 5 are soldered to the back of neighboring cells as shown in FIG. 1b. These cells and the metal pieces are sandwiched between two layers of encapsulant, front encapsulant 2 and rear encapsulant 3. The back sheet 6 is usually of a material with high resistance to moisture penetration to help protect the soldered pieces from corrosion. During lamination, the encapsulant layers 2, 3 soften and fill all gaps between the cells while also adhering the silicon wafers to the front glass and the rear backing layer.

Metallization is an ongoing issue with solar cells. Because screen printing and firing of metal pastes produces poor results, many alternative approaches have been pursued. Some can be quite complex and require many steps and alignments. Process complexity is at odds with low cost. Thus the key to success is to find approaches to reduce the number of steps and processes by inventing inexpensive processes which perform several functions at once. One example is Wenham et al, (U.S. Pat. No. 6,429,037) where a laser is used to simultaneously 1) drive a dopant into silicon, 2) open a dielectric layer, 3) and create a patterned surface for electroless metal plating. This is currently used for front contact cells. In this cell design, one polarity of the cell is contacted on the front side. While such solar cells are common, they have the drawback that the metal collection fingers on the front side shade portions of the solar cell, thereby causing efficiency losses. In order to electrically connect cells in series, conductors need to be soldered to the front side of one cell and then soldered to the back side of the next cell, increasing the handling and assembly complexity. A better approach is to put all the metallization on the back side of the cell. Such a design is called a back contact cell.

In a back contacted solar cell, a plurality of metal-semiconductor contacts, some anodes and some cathodes, are all on the backside of the solar cell. One advantage of the back contact cell design is that it avoids placing a metal contact grid on the front side of the solar cell which obscures part of the solar cell and reduces the absorbed light in the solar cell. Another advantage is ease in connecting cells since only back side to back side soldering is required. A disadvantage of the back contact cell design which has hindered more wide spread adoption, is that the metal on the backside must be patterned such that the two polarities are electrically isolated from each other. Additionally, it is preferred that all the metal of either polarity collect electricity to the fewest number of attachment points for external soldering.

Figure 2:
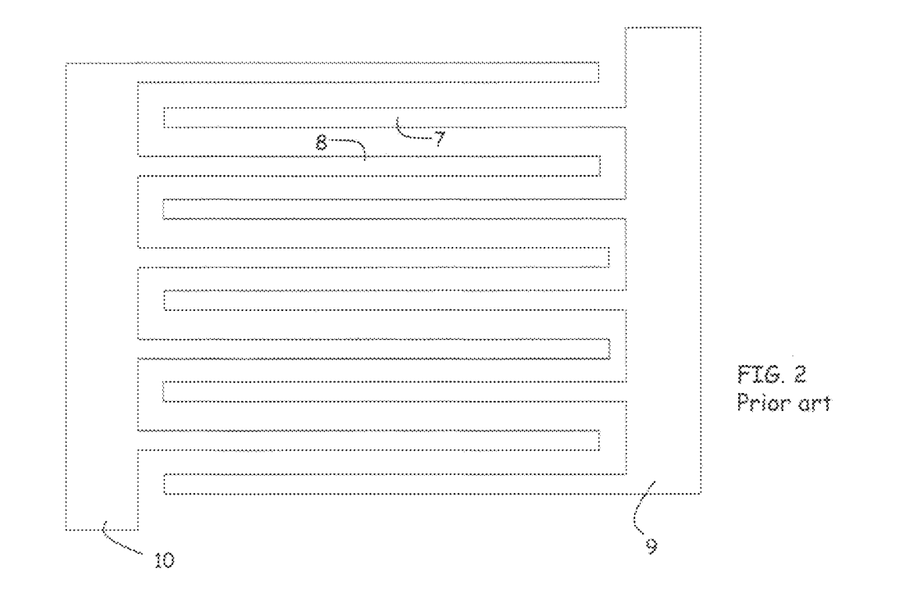
FIG. 2 is an illustration of an interdigitated back contact pattern used in many back contact cells. All the fingers of one polarity 7 or the other polarity 8 each connect to a busbar, 9 and 10 respectively. It is generally desirable that the gap between the fingers 7, 8 be as narrow as possible without shorting the two.

One known pattern is that of interdigitated fingers which resemble two interpenetrating combs as in FIG. 2. The individual fingers of one polarity 7, 8 all connect to a common bus 9, 10 which is the soldering point for external electrical connections. The bus bars usually have portions that have large areas in order to ease the precision required in soldering metal conductors to the cells. This larger area, unfortunately, reduces the usable area of the wafer by not allowing collection fingers of the opposite polarity into the areas of the bond pads. In other words, the large area electrical busses 9, 10 obscure the collection of the opposite polarity carriers in the silicon underneath the busses. Additionally, the metal pattern must have low resistance which usually results in thicker metal layers. For silicon solar cells, thinner and more closely spaced metal fingers are advantageous to reduce losses and series resistance within the semiconductor. However, the fingers themselves must be of low resistance. Thus it is preferable to have fingers of high aspect ratio, of narrow widths and with narrow gaps between the fingers. This has been difficult to accomplish with few process steps and inexpensively.

One approach described by Mulligan et al. (published US application 2008/0210301) is to first deposit a thin blanket metal layer on the cell as an electroplating seed layer. A mask layer is then applied on top of the seed metal layer in a patterned manner. The exposed seed layer (regions without mask layer) is thickened by electroplating to create a thick interdigitated comb structure as in FIG. 2. The electroplating mask is then removed, and a short metal etch removes the exposed thin metal seed layer that was previously covered by the mask. What remains is an electrically isolated interdigitated comb structure such as in FIG. 2. This has a number of processing steps as well as inherent limits on the minimal distances between the fingers.

Hacke et al. (published US patent application 2008/0216887) has detailed several techniques to form and connect back metal patterns. More generally, a back contact solar cell has multiple rear points or regions of metal of either positive polarity or negative polarity. Two functions need to be accomplished for the module to operate. 1) all of the like polarities within a particular solar cell need to be electrically connected and 2) all the like polarities of one solar cell should be connected to the opposite polarity of an adjacent cell. Usually, the term 'bus' or 'busbar' refers to metal that performs task 1) and connects all like polarities of metal contacts on the solar cell. In this work, the solar cells have reduced area busbars, or are entirely busbarless, and current is extracted from several points on the interior of the cell surface. By moving the bus off of the wafer, the metal regions contacting the solar cell can cover more of the wafer and thus increase photogenerated carrier collection and the performance of the cell. The typical disadvantage of this approach is that multiple solder connections must be made between the common bus and each point or region of metal on the interior of the solar cell. More solder points raise the risk of solder failure.

In typical prior approaches, if soldering is required, then only certain metals can be used. Some metals are very difficult to solder to, such as aluminum, stainless steel, and chromium. Solderable metals include such metals as tin, copper, and lead. These metals also happen to be prone to corrosion by moisture. This becomes a module reliability issue and solder failure is one of the failure mechanisms of the module. Thus, in the module assembly, the rear backing layer(s) 6 has to block moisture penetration. Moisture barriers which can provide a solar module with twenty years of failure free operation tend to be expensive.

Another module failure mechanism occurs when the solder joint is mechanically weak. As the modules heat and cool in the day and night, the silicon and the connecting metal tabs expand and contract with differing expansion coefficients. A poorly soldered tab can partially or fully detach. This can increase the resistance in a small spot on the module and create "hot spots". The result is a lowered module output and the hot spots can lead to other failures including delamination or glass breakage.

Soldering itself places local thermal and mechanical stresses on wafers. The solder temperature for lead-free solders can be around 230° C. Such localized temperatures combined with a slight applied pressure can cause fracture in silicon cells, especially as the cells become thinner and more fragile. This may not immediately result in an obvious fracture either. Instead, the cell may be laminated into a module where the fracture causes failure from the lamination stresses. Alternatively, years later, the fracture can grow due to thermal cycling and moisture and cause a significant reduction in the module output.

More generally, thin wafers of 160 um or less have difficulties tolerating the necessary handling of current fabrication processes including, metallization, testing, tabbing (soldering), stringing, and layup. Pick and place tools exert too much local pressure. Tiny flaws or cracks in thin wafers act as stress concentrators and allow for easy crack propagation. Furthermore, screen printing and metal plating can leave stresses that cause the wafer to bow. Thus one approach reported by Hieslmair et al. (published US patent applications 2007/0212510 and 2008/0202576) is to laminate the thin (35 um) silicon material to the front glass early in the process and leave the backside exposed for further cell processing. Back contact cell designs are advantageous for this approach since the fragile silicon is already supported by the front glass.

SUMMARY

In one embodiment, the back contact silicon cells, bypass diodes and external leads are first laminated to the front module glass (leaving the backside of the cell exposed). This provides needed mechanical support when using thin silicon wafers. The full metallization is performed by electro or electroless plating of the entire module, eliminating any need for soldering. Electro or electroless plating can build thick conductive metal layers onto seed metal layer. If the seed metal is patterned, then the plated metal will build on the patterned seed metal only. The process for module assembly disclosed is significantly shorter and requires far less handling of fragile wafers than the prior art approaches. The process can be summarized as follows:

1a) If the back contact cells already have a plating seed layer or full metallization on the rear side, then laminate the cells, bypass diodes, and external leads to the front glass of the module. Leave the back side of the cells with the metal layer exposed.

1b) If the back contact cells do not already have a plating seed layer on them, a plating seed layer can be formed on the rear of the cells after they have been laminated to the front glass. This can be done by many methods including the laser scribing and electroless plating process described by Wenham et al. In this case, the electroless plating is achieved by dipping the entire module into the electroless plating bath upon which only the scribed portions of the cells will be plated.

2) Apply a conductive seed material for plating in locations to be electrically joined, i.e. cell to cell connections, cell to bypass diode connections, and cell to external lead connections. This deposition can be accomplished by dispensing, printing or otherwise depositing conductive inks, pastes, or other material between the cells or parts to be electrically connected.

3) The entire module is then immersed in one or more plating baths, and the cell finger metallization as well as the entire module circuit is built up by plating. There is thus no need for tabbing and soldering which has significant risks of damaging thin fragile cells and creating possible failure modes over the course of the module lifetime. Additionally, stresses caused by metal plating in the cell are mitigated since the cells are supported by being laminated to the glass.

4) Furthermore, highly corrosion resistant metals can be plated, especially the last layer, to greatly reduce the hermetic requirements of the module backing material, and thus opening possibilities for new material and significantly reduced costs.

BRIEF DESCRIPTION OF THE DRAWINGS

FIG. 6 is an example of the double comb and bus bar shape. Each one of these shapes in a module is electrically isolated from each other, making electroplating difficult. Electroless plating can be used and/or temporary electrical conductors can be used to join all the double comb shapes

FIG. 9*a* shows the cells 42 with a plating seed layer 43 laminated to a front glass 40 with an encapsulant 41. Also shown laminated are the external leads 46. In FIG. 9*b*, a plating seed material 44 is applied in select locations to form connections. In FIG. 9*c*, a metal layer 45 is plated to create current carrying metallization.

DETAILED DESCRIPTION

This invention relates to processing of thin back contact solar cell wafers into modules. The wafers should already have appropriately doped regions. Since the metal is being plated, a seed metal pattern is required. The thickness of the seed layer can be from 0.1 microns to 100 microns. The formation of the seed metal pattern can be done before or after the wafer is laminated to the front glass of the module.

Figure 3:
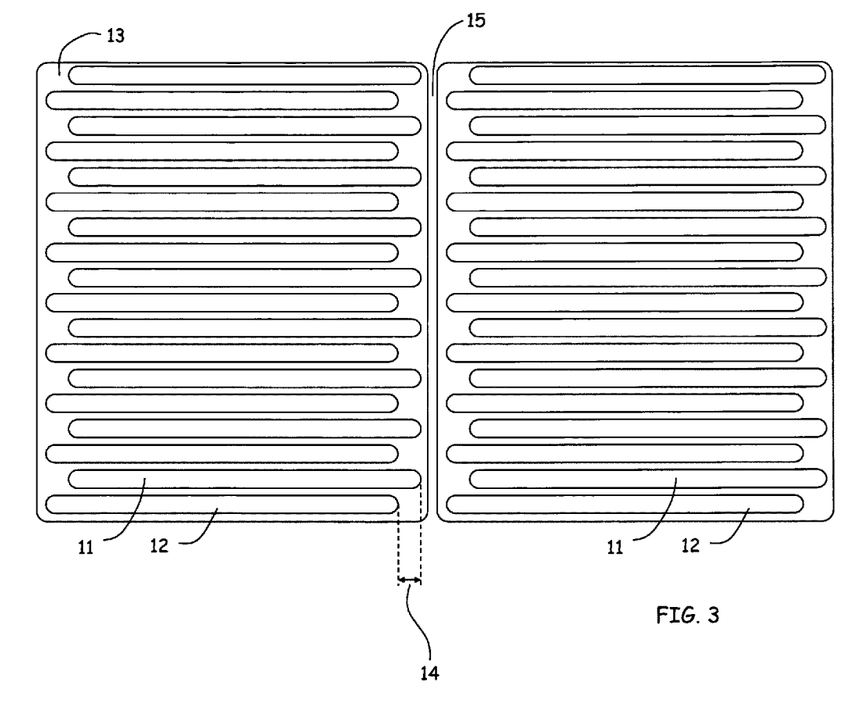
FIG. 3 is an illustration of shifted stripes as a seed layer for subsequent metal plating. This is similar to FIG. 1 but without the bus bars 9 and 10. All the stripes of one polarity 11 are shifted toward one edge of the cell while all the stripes of the opposite polarity 12 are shifted toward the opposite edge by a small amount 14. This pattern is easy to implement with a shadow mask.

While a regular interdigitated contact structure can be used, the preferred thin seed metal pattern is that of slightly shifted stripes 11, 12 as in FIG. 3. Here 15 is the seam between adjacent solar cells. Stripes of one polarity are shifted toward one edge and the other polarity toward the other edge. The amount of shifting 14 is preferably greater than 0.1 mm and less than 8 mm. The shifting makes it easier for simple printing to contact alternate stripes. The stripes, however, need not be shifted. Some printing techniques have high enough resolution, such as inkjets, can print a trace pattern that contacts every other stripe. Shifted or non-shifted, a stripe pattern has the advantage of moving the functionality of the bus bar and contact pads off of the cell, allowing for more carrier collection.

The stripe pattern can be easily created using a simple shadow mask based on wires. A shifted strip pattern can be created using wire mask 30 with tabs 32 such as in FIGS. 7*a* and 7*b*. Since the seed metal builds up on the mask during every deposition, the mask will require occasional acid etch cleaning. Such a mask can be formed with thin wires 31 of acid etchant resistant materials such as nickel or glass of 10 to 100 microns in diameter. Thus it is preferred that the wires and the frame that holds the wires be of an acid resistant material. For example, nickel is more etch resistant to a number of acids which will readily attack aluminum which is a preferred seed metal. Glass fibers are even more resistant to acid etches than most metals.

Figure 7A:
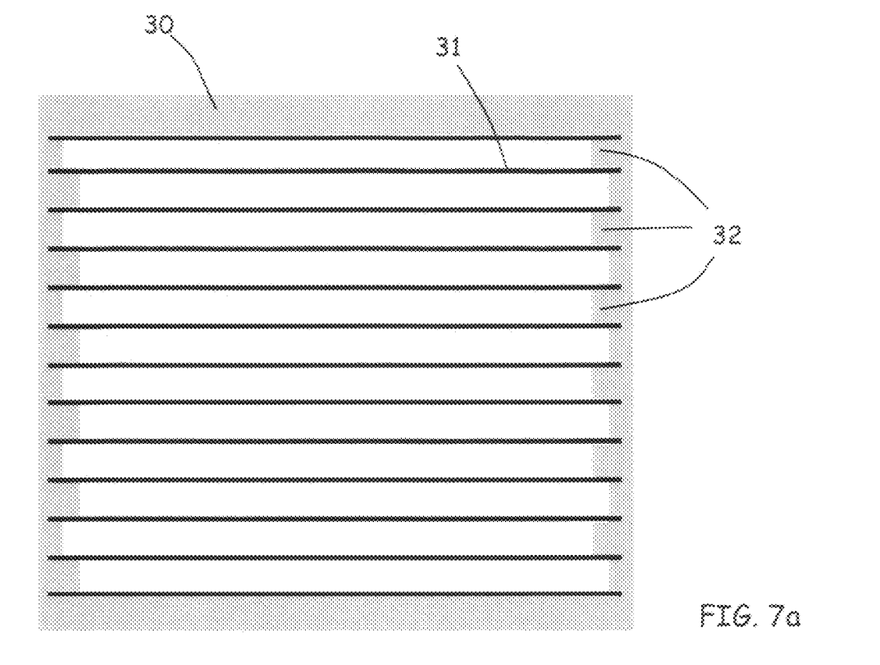
FIGS. 7*a* and 7*b* illustrate a wire-based 31 shadow mask. The tabs on the frame 32 create the offset 14 in the deposited seed metal stripes, 11 and 12 in FIG. 7*b*.
Figure 7B:
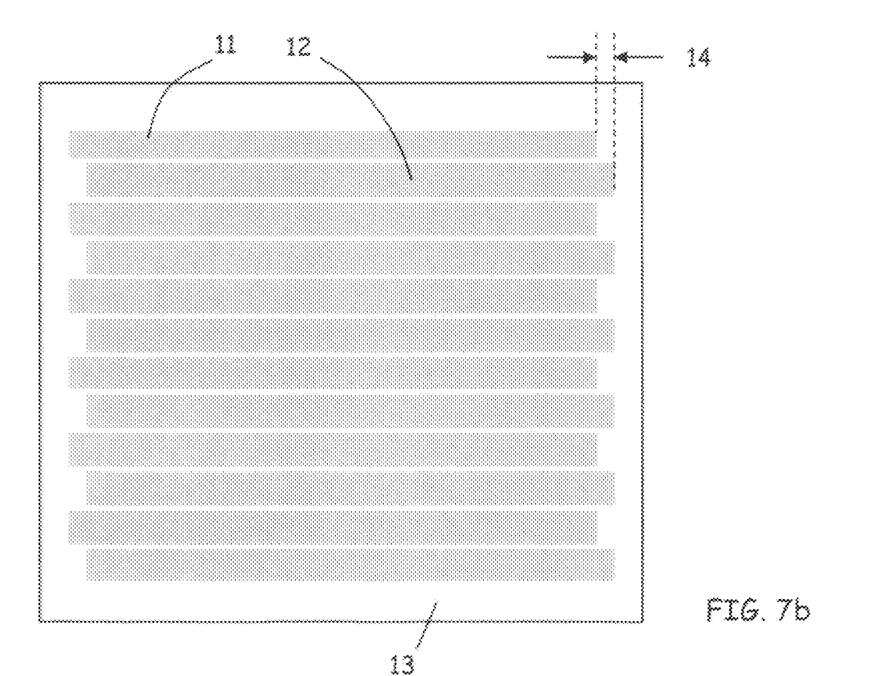
Figure 8A:
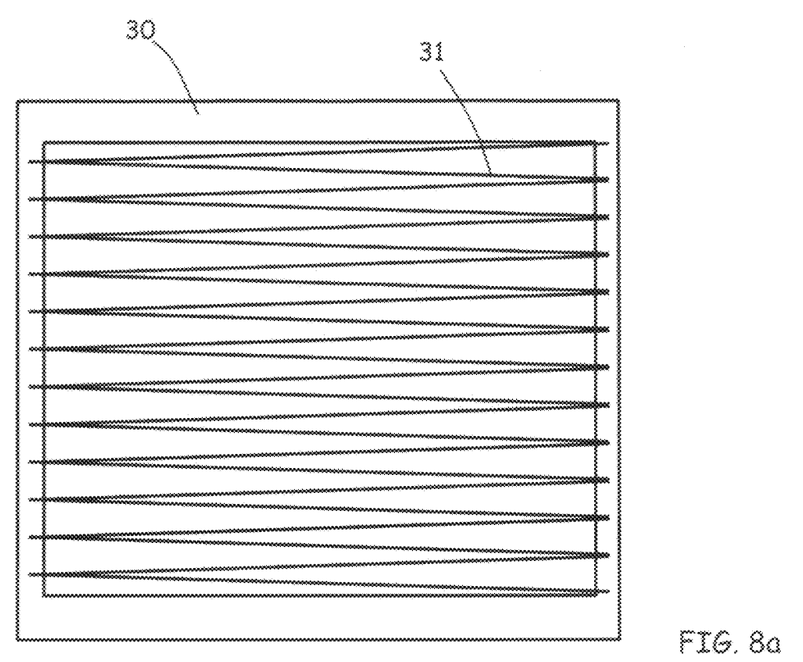
FIGS. 8*a* and 8*b* illustrate an alternative wire-based shadow mask. The wires 31 are angled and cross before reaching the opposite end. Thus metal fingers of one polarity only reach the opposite edge.
Figure 8B:
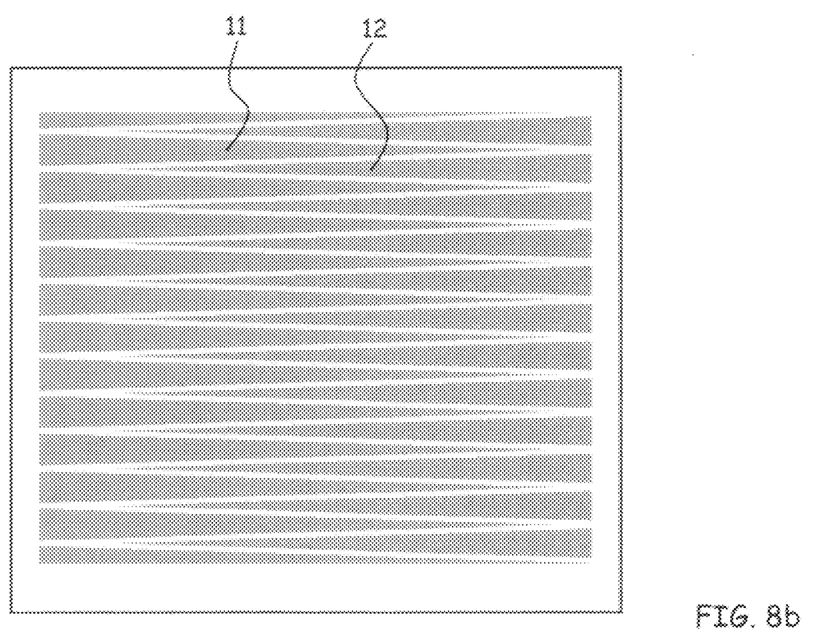

The shifting 14 of the seed stripes can be implemented by adding tabs 32 on the frame which hold the wires as in FIGS. 7*a* and 7*b*. The resulting metal pattern shown in FIG. 7*b* clearly shows the metal stripes shifted relative to each other. An alternative is to have angled wires that meet or cross before one edge as shown in FIGS. 8*a* and 8*b*. This approach is advantageous since the finger becomes wider at the base. As current is collected along the length of the finger, the width of the finger increases to help reduce the resistive losses.

Figure 9A:
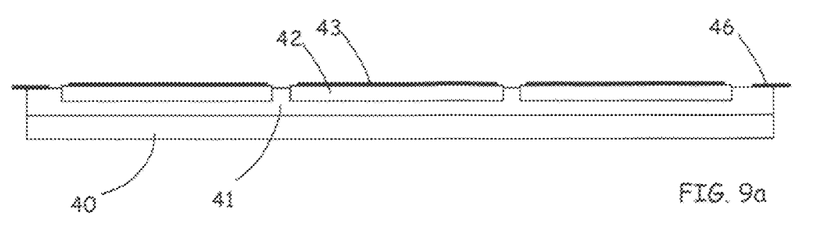
FIGS. 9*a*, 9*b*, and 9*c* show a cross section of the module at various steps.
Figure 9B:
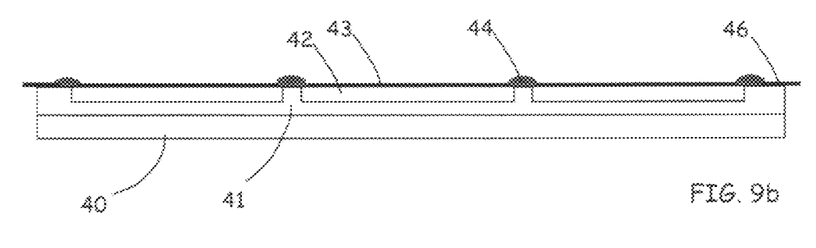
Figure 9C:
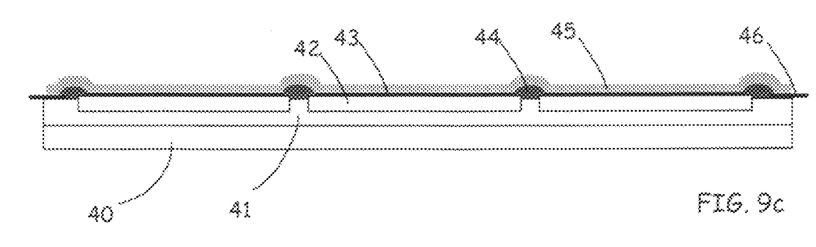

If the seed metal pattern is formed before lamination, then a short thermal anneal such as an forming gas anneal (FGA) can be performed in order to improve the electrical contact between the metal and silicon. The wafers are then laminated to the front glass using common lamination techniques and encapsulant materials in the photovoltaic industry. Bypass diodes and external leads can also be laminated in place during this step, or they can be attached later. A cross section of this is shown in FIG. 9*a*. The front glass 40 in this case is at the bottom of the figure. Cells 42 are laminated to the front glass 40 with an encapsulant layer 41. The rear encapsulant and the rear backing materials are not included at this stage. Thus, the seed metal layer on the cells 43 is exposed for further processing.

If the seed layer on the cells is to be formed after lamination to the front glass, then a process similar to Wenham et al. could be used. Simply, a patterned laser ablation of the dielectric passivation on the rear of the cell is followed by dipping the entire module into an electroless plating bath to form the seed layers. Other known processes are also capable of forming this seed layer as well. Again, the preferred seed pattern is that of shifted stripes as in FIG. 3. Local and/or fast heating methods using lasers or RTA flash may be employed to anneal the seed metal without damaging the encapsulant holding the silicon to the front glass.

Figure 4:
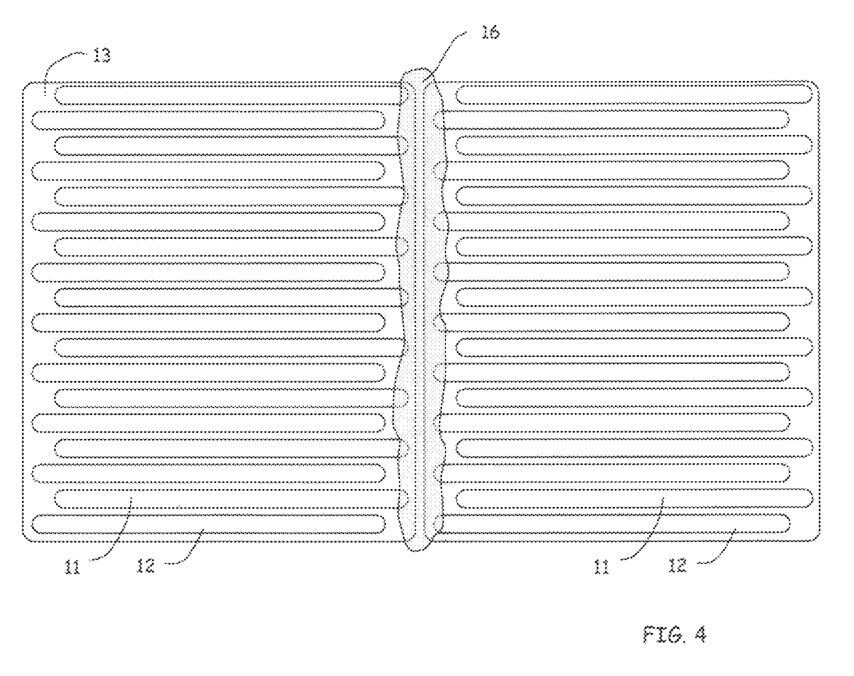
FIG. 4 is an illustration of shifted stripes 11, 12 with a conductor deposited along the seam between cells. The conductor touches the stripes of one polarity closest to the seam on one cell 11 and electrically connects them to the stripes of the opposite polarity 12 on the adjacent cell.

Once the silicon wafers 13 are laminated to the glass and the seed layer stripes are formed as shown in FIG. 3, the cells can be connected in series. Cell-to-cell plating seed material is deposited along the seam 15 between the two cells. The cell-to-cell plating seed material can be deposited using a variety of techniques including printing or dispensing of conductive inks, conductive epoxies, shadow masking and spraying of conductive material, shadow masking and physical vapor deposition (PVD) of a conductor, or other material that will serve as an electroplating seed layer. These materials are deposited along the edges of neighboring cells such that the seed lines of one polarity 12 make contact to the conductive ink 16 as in FIG. 4. Also, the seed lines of the opposite polarity 11 also make contact to the deposited seed material 16. Thus the cell-to-cell connections are seeded. The entire panel is then submerged into one or a series of plating solutions to create thicker and low resistance patterned conductors on the cells, as well as connecting cells to each other in a series circuit. Thus the deposited conductive inks are not necessarily the major current carriers. Instead, they act as a seed material upon which a metal is plated. The plated metal is the primary current carrier. A plating thickness of 10 um to 40 um of copper or similar metal can bridge two cells and will have a low series resistance.

Bypass diodes and external electrical leads can also be included in the cell circuit. The bypass diode and external leads are electrically connected to the module circuit with a plating seed conductive ink or epoxy. During plating, the diode and external leads become part of the circuit. The plating thickens the electrical connection to these parts. The conductive ink or epoxy material is not the main current carrying material. The plated metal which bridges over the conductive epoxy is the main current carrier. If the diode or external leads are not laminated to the front glass simultaneously with the wafers, they can be glued in place before the plating step.

The entire module, with or without a polymer frame, is then immersed in a plating bath. An electroless plating bath can plate the whole module with metals such as copper or nickel. Copper is less expensive. Because the external leads and the by-pass diodes were included in the module plating steps, no additional soldering is necessary on the module.

Because no soldering is necessary, the last metal plating layer can be designed to be a very corrosion resistant metal such as chromium, nickel, vanadium, and tantalum. Alloys of such metals may also be suitable for providing corrosion resistance. This is not possible in current module assembly approaches since chromium and other corrosion resistant metals can not be soldered easily. It is because there are no solder connections in the approach of the present invention and because the last metal layer can be highly corrosion resistant, that the requirements of the module backing materials, as far as blocking moisture, can be significantly relaxed. Thus expensive moisture barriers, such as Tedlar™, commonly used in current module manufacturing are not required in this approach. This opens new possibilities for lower cost module backing materials. Some protection from electrical shorting, scratches, and debris is needed. One approach is to spread or spray liquid silicone or other appropriate polymer which will cure/harden without the need for a second lamination step. Spreading a liquid can be done with a doctor-blade approach or by spraying the material onto the back of the module. If the module has a frame, any polymer with low viscosity can be poured onto the back and allowed to harden. This could also help hold the frame and module in place, giving added strength to the module.

A typical practice, in wafer based solar cell manufacturing, is to complete the metallization on each cell and to test each cell in order to better match cells to be laminated together in a module. In this way, module output is maximized despite manufacturing variations in cell efficiency. In the present approach, the cell is completed with thick metal only after the cell is already laminated. Thus it may appear that pre-sorting and binning of cells is not possible. However, there are some methods to perform a preliminary screening of cells. Methods know to the industry such as quasi-steady state photo-conductance (QSSPC) lifetime testing, for example, can measure average wafer minority carrier lifetime. This information can be used as a measure of cell quality and a partial predictor of the finished cell performance. There are increasingly sophisticated lifetime mapping methods which are non-contact and fast. Some are based on photoluminescence, others on infrared transmission or absorption. Any of these techniques might be used to pre-sort cells before lamination. If a seed metal is deposited on the cell before lamination to the front glass, then it is possible to perform a illumination vs. open circuit analysis (Suns-Voc) which is a better predictor of cell performance. With the right apparatus that makes gentle and multiple contacts to the seed metal, the cell could be tested with the standard current-voltage (IV) test procedure.

Figure 5A:
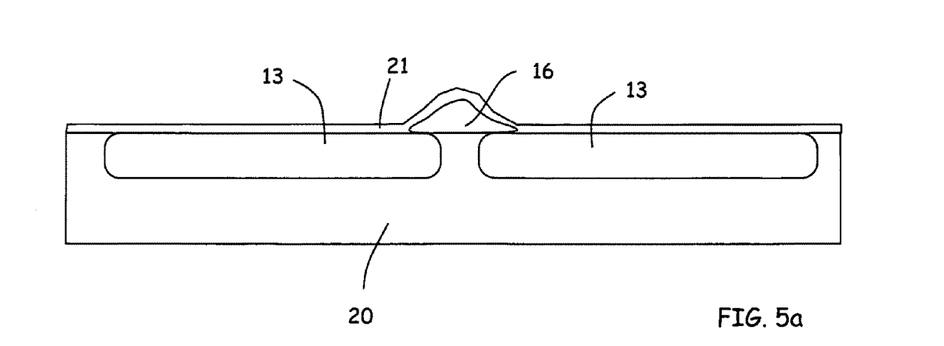
FIGS. 5*a* and 5*b* illustrate the advantage of having a raised or lowered conductor, respectively, on the seam between two cells 13. After metal plating, the plated metal, which is bridging the seam, can have significantly more flexibility than if the metal were coplanar with the wafers and module.
Figure 5B:
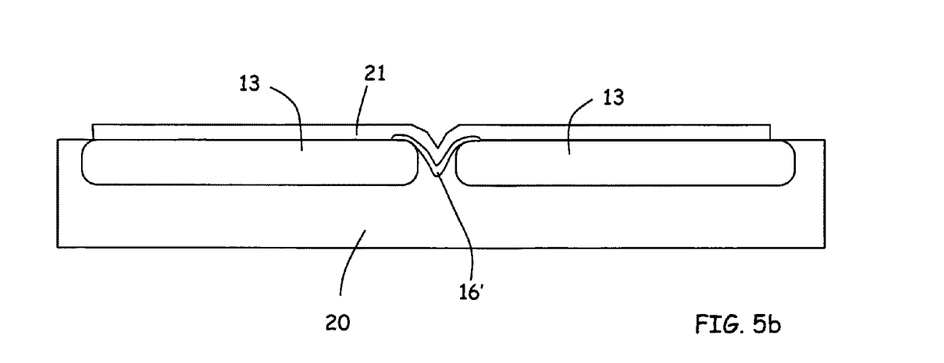

It is additionally preferable that the plated metal between two cells 16 is not coplanar with the cells as shown in FIGS. 5a and 5b. When in the outdoors, the module temperature rises and falls, causing a slight expansion and contraction of the module. The cells 13 themselves move slightly together and apart due to the higher thermal coefficient of expansion of the front glass. If the cell-to-cell plated metallization is coplanar with the cells, then there is a higher probability that the metal will tear or fatigue. If the interconnecting metal is not coplanar with the cells, then the plated metal can flex and there is a far lower probability of failure. There are two approaches to making a non-coplanar bridge: indentation toward the front glass (valley) or rising away from the front glass (mound).

The conductive seed layer itself 16 can be used to create a mound such that the plated metal 21 is no longer coplanar with the cells as in FIG. 5a. The mound is built by dispensing seed conductor material on the encapsulant 20 between two cells. The seed conductor material lays on both edges of the neighboring cells 13 forming a series connection. Alternatively, during the lamination, the encapsulant is allowed to leak between the cells and create a mound 16. Another option is to add a separate part of either metal of insulator to create a mound 16. The final plated metal rises over the mound and connects the two cells. If the cells move closer or farther apart, the plated metal 21 can flex without failing.

The other approach is to form a valley 16' in the encapsulation during lamination or afterwards. The seed conductor material is dispensed such that the edges of both neighboring cells are contacted as in FIG. 5b. The plated metal 21 covers the cell and the seed conductor and is not coplanar with the cells. Again, if the cells move closer or farther apart, the plated metal 21 can flex without failing.

Figure 6:
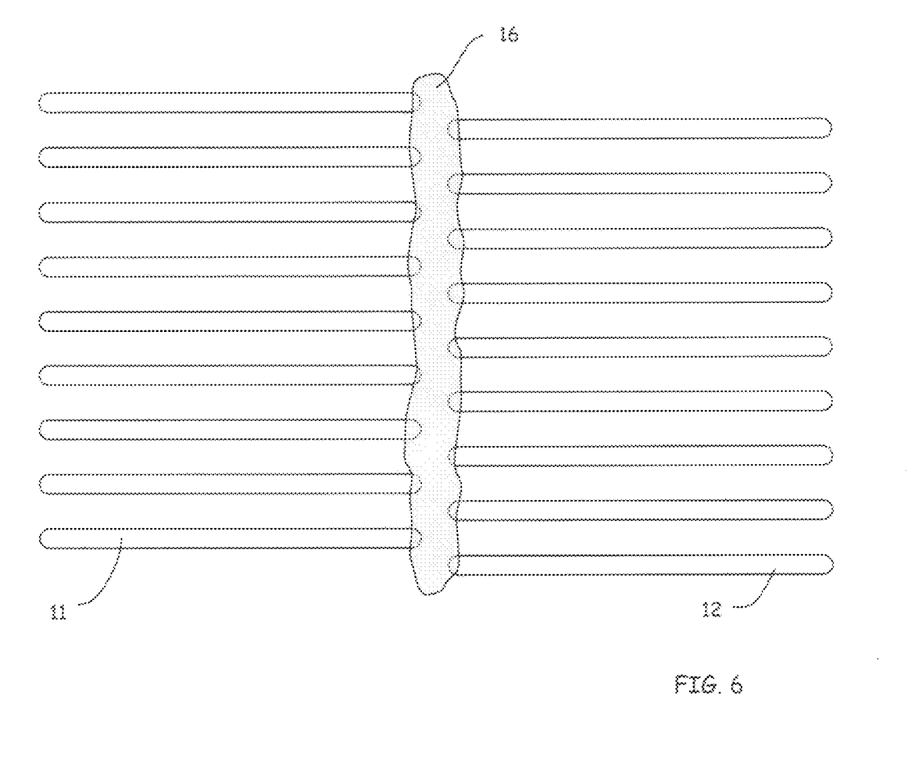

Each double comb seed structure (FIG. 6) formed should be electrically isolated. This posses no problem for electroless plating techniques which does not require an applied voltage on the part to be plated. However, for speed and cost considerations, electroplating may be more desirable. In this case, an electrical connection need to be made to each double comb structure. There are several methods to do this. Thin conductive and insulated wires may be temporarily attached to each double comb structure with a conductive epoxy or other attachment. This can be done simultaneously during the inter-cell seed trace deposition of in a separate step. After the electroplating, the wires are removed and/or cut.

Alternatively, a temporary trace pattern can be added to the module which connects all the double comb structures. This can be done while dispensing the cell-to-cell ink or paste.

After electroplating, this temporary trace is removed or severed in order to electrically isolate each double comb structure again.

Figure 10A:
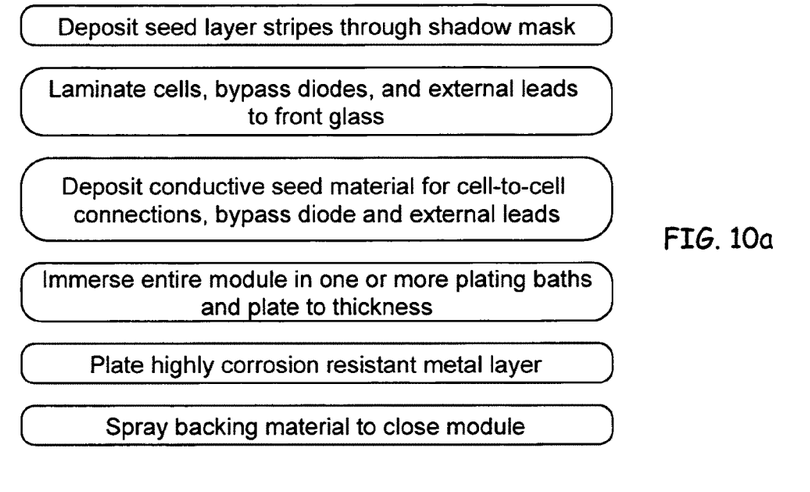
FIGS. 10*a* and 10*b* show examples of process flows for two types of approaches: wafers with seed metal fingers before lamination (10*a*) and forming the seed metal fingers on the wafers after lamination (10*b*).
Figure 10B:
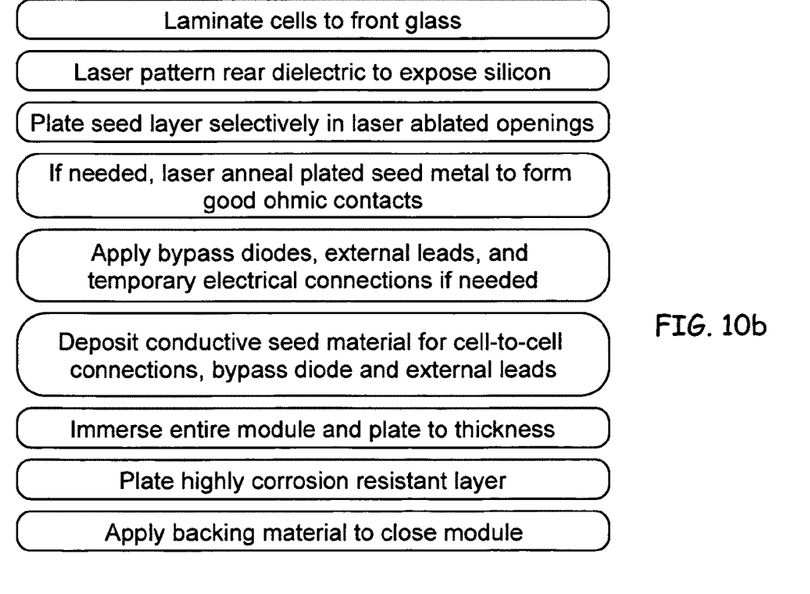

Two different process flows are shown in FIG. 10a and FIG. 10b which illustrate forming a seed layer before lamination as well as a seed layer after lamination. These are examples and other variations are also possible.

In FIG. 10a, shifted metal stripes are deposited through a shadow mask on the wafer first. Presumably, these metal stripes are in contact with areas of the solar cell that are either anodes or cathodes. The cells 42 as well as the bypass diodes and external leads 46 are then laminated to the front glass such that the cell seed layer is opposite the glass and thus exposed as in FIG. 9a. A conductive seed material 44 is deposited in the seam between cells using for example a dispensed conductive epoxy. Temporary electrical connections can be made to assist in electroplating. Once the seed conductor is cured or hardened, the entire module is immersed into one or more plating baths to create a thick metal layer 45. The last metal to be plated is a highly corrosion resistant metal such as chromium. The plated metal 45 electrically connects the appropriate regions of the cells to other cells, bypass diodes and external leads. Lastly, a liquid silicone or epoxy is sprayed onto the back module and cured.

In another example whose process steps are shown in FIG. 10b, the cells are first laminated to the front glass. A rear dielectric can be laser ablated to form shifted stripes. The first plating bath may be used to create a seed layer of metal using, for example electroless nickel. This selective electroless plating process has been demonstrated and is known in the industry. Bypass diodes, external leads, and polymer frame can be attached to the module. The next step is to deposit the conductive seed pattern in the seam between cells as well as to connect bypass diodes and external leads to the module circuit. Similarly, a dispensed conductive epoxy is used. Temporary electrical connections can be made to assist in electroplating. Once cured or hardened, the entire module is immersed into one or more plating baths to create a thick patterned metal. The last metal to be plated is a highly corrosion resistant metal. Lastly, a backing material is applied to finish the module.

Figure 11A:
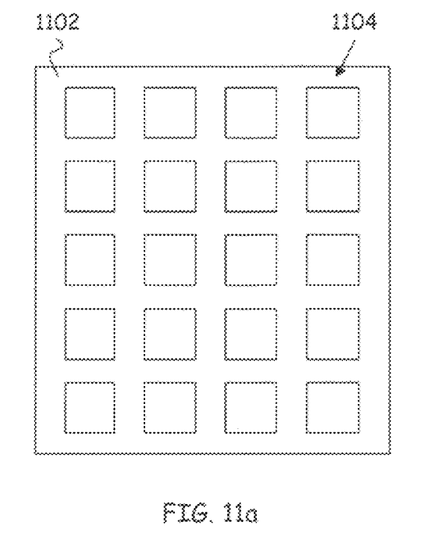
FIGS. 11*a-d* show an example of a process flow according to an embodiment of the invention.
Figure 11B:
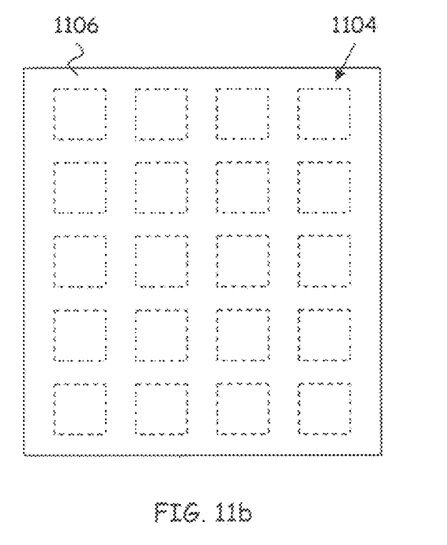
Figure 11C:
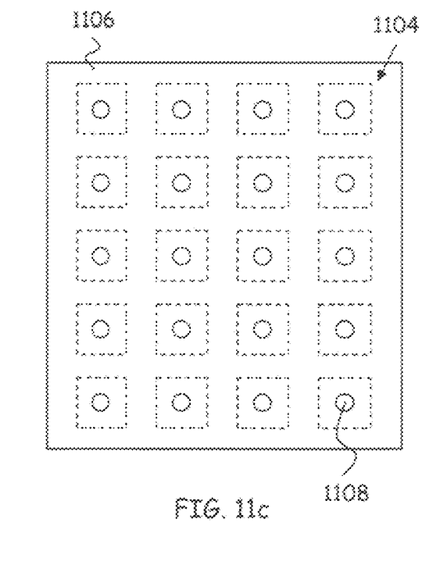
Figure 11D:
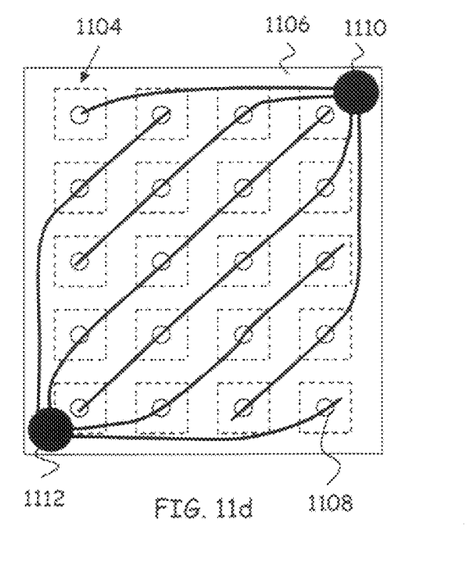

In another example, shown in FIGS. 11a-d, the solar cell wafers 1102 can have metallized back-side contacts 1104 that are covered by a transparent and uniform dielectric layer 1106 (e.g., a polymer). Since the dielectric layer is transparent, one can still see the regions of metal on the rear of all the solar cells. A laser or other means could puncture or remove the polymer only where there are regions of metal, thereby opening up holes, one of which is referenced as 1108, in dielectric layer 1106 to expose back-side contact 1104. Then a conductive seed paste or ink can be applied in a pattern across the rear polymer in order to create the proper connections of 1) like polarities within a cell and 2) cell to cell connections of opposite polarities. For example, cells can be connected to terminals 1110 and 1112 as shown on FIG. 11d. Then the whole panel can be immersed in the plating solution to increase the thickness of the seed paste. FIG. 11a shows the situation prior to deposition of dielectric layer 1106, FIG. 11b shows the result of depositing dielectric layer 1106, FIG. 11c shows the result of patterning dielectric layer 1106 to expose contacts 1104, and FIG. 11d shows the result of depositing the pattern of conductive seed paste or ink.

Figure 12:
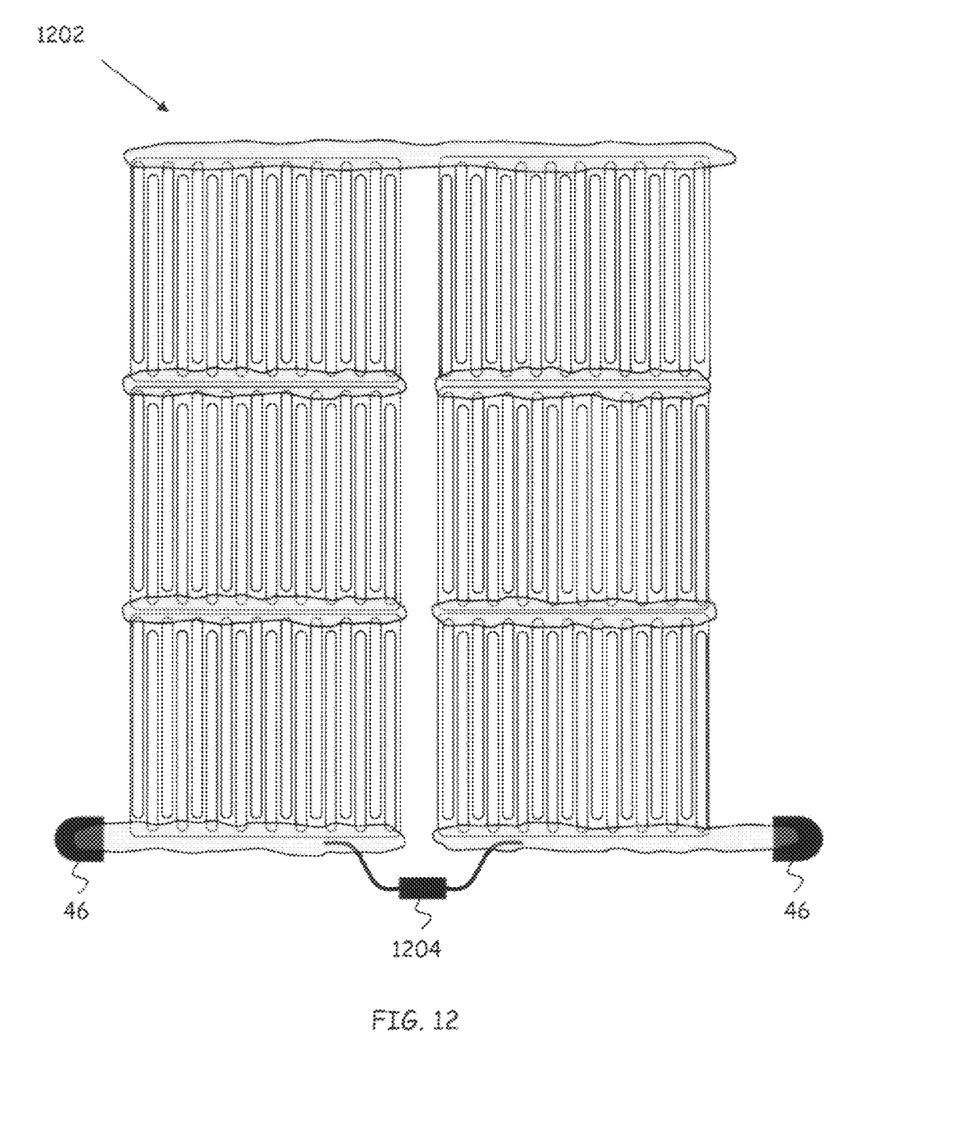
FIG. 12 shows an example of a solar cell module including a bypass diode.

FIG. 12 shows an arrangement 1202 of solar cells having a typical configuration of external leads 46 and a bypass diode 1204. Several such arrangements are typically connected together in series in a solar cell module. The purpose of bypass diode is to permit current flow in the series-connected string, even if some of the cells have high resistance or even act as an open circuit. For example, a cell that is shaded can have high resistance, and a defective cell can also have high resistance or be an open circuit.

This invention provides a method of assembling a module with fewer process steps, with less handling of fragile silicon wafers, without any soldering steps, with improved corrosion resistance, and with lower costs of module materials and assembly.

What is claimed is:

1. A method of fabricating a back-contact solar cell module, the method comprising:
   a) providing two or more discrete back contact solar cells affixed to a front transparent sheet;
   b) providing a plating seed pattern on and electrically connecting at least two of the two or more solar cells;
   c) plating one or more metals onto the module, wherein the plating seed pattern defines where plating will occur;
   wherein the providing the plating seed pattern comprises depositing a plating seed material, and wherein the plating seed material is deposited as a viscous liquid that hardens after deposition.

2. The method of claim 1, wherein the back contact solar cells include a back side plating pattern.

3. The method of claim 1, wherein the providing the plating seed pattern comprises:
   i) providing solar cells having back-side metal contacts covered by a uniform dielectric layer;
   ii) patterning the dielectric layer to expose the back-side metal contacts; and
   iii) depositing the plating seed material to electrically connect two or more of the solar cells to each other via their corresponding back side metal contacts.

4. A method of fabricating a back-contact solar cell module, the method comprising:
   a) providing two or more discrete back contact solar cells affixed to a front transparent sheet;
   b) providing a plating seed pattern on at least two of the two or more solar cells;
   c) plating one or more metals onto the module, wherein the plating seed pattern defines where plating will occur;
   wherein the providing the plating seed pattern comprises:
   i) providing solar cells having the back sides of the solar cells covered by rear cell dielectric layers prior to affixing the solar cells to the front transparent sheet, wherein the back sides of the solar cells are not metallized;
   ii) laser ablating the rear cell dielectric layers to expose selected regions of the cells after affixing the solar cells to the front transparent sheet;
   iii) immersing the module into an electroless plating path to form a thin plating metal layer in the laser ablated regions;
   iv) annealing the thin plating metal layer to form low resistance interfaces between metal and silicon that serve as the plating seed pattern;
   wherein the plating seed pattern electrically connects two or more of the discrete back contact solar cells.

5. The method of claim 1, wherein the protective backing material may or may not include a moisture barrier.

6. The method of claim 1, wherein a last metal layer deposited by plating comprises a corrosion resistant metal.

7. The method of claim 1, wherein the plating one or more metals onto the module comprises immersing the module into one or more plating baths.

8. The method of claim 1, wherein the front transparent sheet comprises glass.

9. The method of claim 1, wherein the plating seed material comprises a viscous polymer which hardens after deposition and additives in the polymer to enhance metal plating.

10. The method of claim 1, wherein the plating seed material comprises small particles that are annealed after deposition.

11. The method of claim 1, wherein the plating seed material comprises a soluble metal compound which decomposes upon annealing to leave a metal layer.

12. The method of claim 1, wherein the plating seed material is deposited at selected locations on the module by a method selected from the group consisting of: jetting with piezo based nozzles, thermal based nozzles, or utilizing an aerosol; dispensing through an orifice or a needle; transferring material from or through a removable layer or carrier; and shadow masking a spray or stream of material.

13. The method of claim 1, wherein the providing the plating seed pattern is performed after affixing the solar cells to the front transparent sheet.

14. The method of claim 1, wherein the providing two or more discrete back contact solar cells affixed to the front transparent sheet comprises:

providing the two or more discrete back contact solar cells; and affixing the two or more discrete back contact solar cells to the front transparent sheet.

15. A method of fabricating a back-contact solar cell module, the method comprising:

a) providing two or more discrete back contact solar cells affixed to a front transparent sheet;

b) providing a plating seed pattern on at least two of the two or more solar cells;

c) plating one or more metals onto the module, wherein the plating seed pattern defines where plating will occur;

wherein the providing two or more discrete back contact solar cells affixed to the front transparent sheet comprises:

affixing two or more discrete silicon pieces to the front transparent sheet; and forming the two or more discrete back contact solar cells by backside processing of the silicon pieces;

wherein the plating seed pattern electrically connects two or more of the discrete back contact solar cells.

* * * * *